(12) United States Patent
Suzuki et al.

(10) Patent No.: US 8,269,314 B2
(45) Date of Patent: Sep. 18, 2012

(54) DISPLAY APPARATUS

(75) Inventors: Takahito Suzuki, Tokyo (JP); Tomohiko Sagimori, Tokyo (JP); Hiroyuki Fujiwara, Tokyo (JP); Tomoki Igari, Tokyo (JP); Yusuke Nakai, Tokyo (JP); Hironori Furuta, Tokyo (JP); Mitsuhiko Ogihara, Tokyo (JP)

(73) Assignee: Oki Data Corporation, Tokyo (JP)

( * ) Notice: Subject to any disclaimer, the term of this patent is extended or adjusted under 35 U.S.C. 154(b) by 424 days.

(21) Appl. No.: 12/071,943

(22) Filed: Feb. 28, 2008

(65) Prior Publication Data

US 2008/0219006 A1 Sep. 11, 2008

(30) Foreign Application Priority Data

Mar. 7, 2007 (JP) .................. 2007-057391

(51) Int. Cl.
 *F21V 29/00* (2006.01)
(52) U.S. Cl. ......... 257/618; 257/712; 257/720; 362/294
(58) Field of Classification Search .................. 257/712, 257/720, E33.075, E23.08, 618; 362/294
 See application file for complete search history.

(56) References Cited

U.S. PATENT DOCUMENTS

| | | | | |
|---|---|---|---|---|
| 6,541,908 B1* | 4/2003 | Cheung et al. | ................ | 313/503 |
| 6,633,123 B2* | 10/2003 | Tazawa | ................ | 313/506 |
| 6,857,767 B2* | 2/2005 | Matsui et al. | ................ | 362/373 |
| 7,045,438 B2* | 5/2006 | Yamazaki et al. | ................ | 438/455 |
| 7,528,421 B2* | 5/2009 | Mazzochette | ................ | 257/99 |
| 2001/0040645 A1* | 11/2001 | Yamazaki | ................ | 349/42 |
| 2002/0043929 A1 | 4/2002 | Tazawa | | |
| 2003/0072153 A1 | 4/2003 | Matsui et al. | | |
| 2005/0285518 A1* | 12/2005 | Cok | ................ | 313/512 |
| 2006/0197102 A1* | 9/2006 | Ogihara et al. | ................ | 257/99 |
| 2008/0225523 A1* | 9/2008 | De Samber et al. | ................ | 362/249 |

FOREIGN PATENT DOCUMENTS

| | | |
|---|---|---|
| EP | 1 699 091 A2 | 9/2006 |
| JP | 6-340118 | 12/1994 |
| JP | 2006-65011 | 3/2006 |
| JP | 2006-261218 | 9/2006 |
| JP | 2006-269716 | 10/2006 |
| JP | 2006-319099 | 11/2006 |
| WO | WO 01/24290 A1 | 4/2001 |
| WO | WO 2006/103596 A2 | 10/2006 |
| WO | WO 2007/008717 A1 | 1/2007 |

* cited by examiner

*Primary Examiner* — Ha Tran T Nguyen
*Assistant Examiner* — Jordan Klein
(74) *Attorney, Agent, or Firm* — Rabin & Berdo, P.C.

(57) ABSTRACT

The present invention supplied a display apparatus using plastic substrate instead of glass substrate, which can solve such problems that the plastic substrate has a low heat conductivity and its heat release performance becomes bad so that it is difficult to obtain stable performance and reliability. In the display apparatus, inner surface electrode integrated with vertical wiring between plastic substrate and thin film LED 102 is accumulated, the inner surface electrode acts as a heat release layer for releasing heat produced inside the thin film LED 102.

8 Claims, 15 Drawing Sheets

DISPLAY APPARATUS

BACKGROUND OF THE INVENTION

1. Field of the Invention

The invention relates to a display apparatus formed by bonding semiconductor thin film element on a plastic substrate.

2. Related Background Art

In recent years, display apparatuses are unceasingly making progress on development for lightening and thinning, and the demand for flexible display apparatuses represented by electronic paper is increasing continuously. In the past, a thin type display apparatus mainly adopted a rigid glass substrate, however, the glass substrate is weak with respect to impact, so that it easily incurs damage such as a break, crack, slit or the like. Further, because the glass substrate has a bigger specific gravity, a disadvantage is produced that the whole apparatus becomes heavy. Therefore, instead of the glass substrate, a plastic substrate is used so as to improve impact ability and to lighten the whole apparatus.

However, in the display apparatus using the plastic substrate instead of the glass substrate, because the heat conductivity of the plastic substrate is low so that the heat release performance of the plastic substrate is weak, it is difficult to obtain stable performance and reliability.

[Patent Document 1] Japan patent publication 2006-269716

SUMMARY OF THE INVENTION

It is, therefore, an object of the invention to provide a display apparatus capable of solving the above problem.

According to the present invention, there is provided a display apparatus formed by bonding semiconductor thin film element on a plastic substrate, comprising a heat release layer placed between the plastic substrate and the semiconductor thin film element.

Further, according to the present invention, there is also provided a display apparatus formed by bonding a semiconductor thin film element on a plastic substrate, comprising a thin film metal layer for promoting heat release that is formed on a surface of the semiconductor thin film element.

According to the display apparatus of the present invention, through interposing an inner surface electrode formed as a heat release layer between the plastic substrate and the semiconductor thin film element, it is possible to effectively release heat produced inside the semiconductor thin film element. As a result, it is possible to obtain such display apparatus having long life, high output and high reliability.

The above and other objects and features of the present invention will become apparent from the following detailed description and the appended claims with reference to the accompanying drawings.

DETAILED DESCRIPTION OF THE PREFERRED EMBODIMENTS

Embodiments of the invention will be described in detail hereinbelow with reference to the drawings.

Embodiment 1

Figure 1:
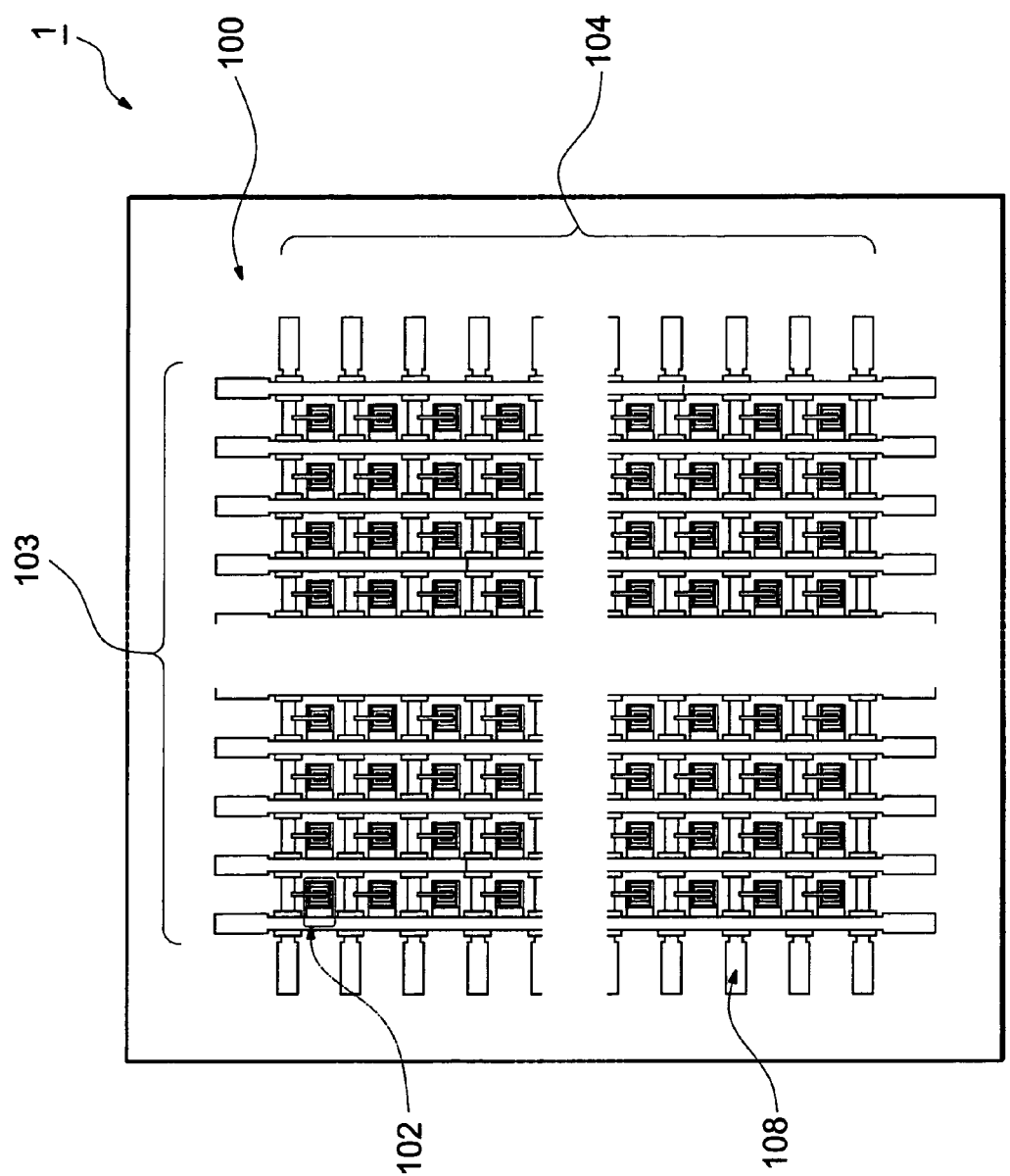
FIG. 1 is a plane drawing showing overall structure of a display apparatus in embodiment 1.

FIG. 1 is a plane drawing showing overall structure of a display apparatus in embodiment 1.

As shown by FIG. 1, a display apparatus 1 of the embodiment 1 is formed by arranging a plurality of thin film LEDs 102 serving as semiconductor thin film elements on a plastic substrate 100 with a matrix manner. Further, anodes in the same queue of the thin film LEDs 102 are connected with a transverse wiring 104 having a connection use pad 108, and cathodes in the same row of the thin film LEDs 102 are connected with a vertical wiring 103 having a connection use pad 108.

Figure 2:
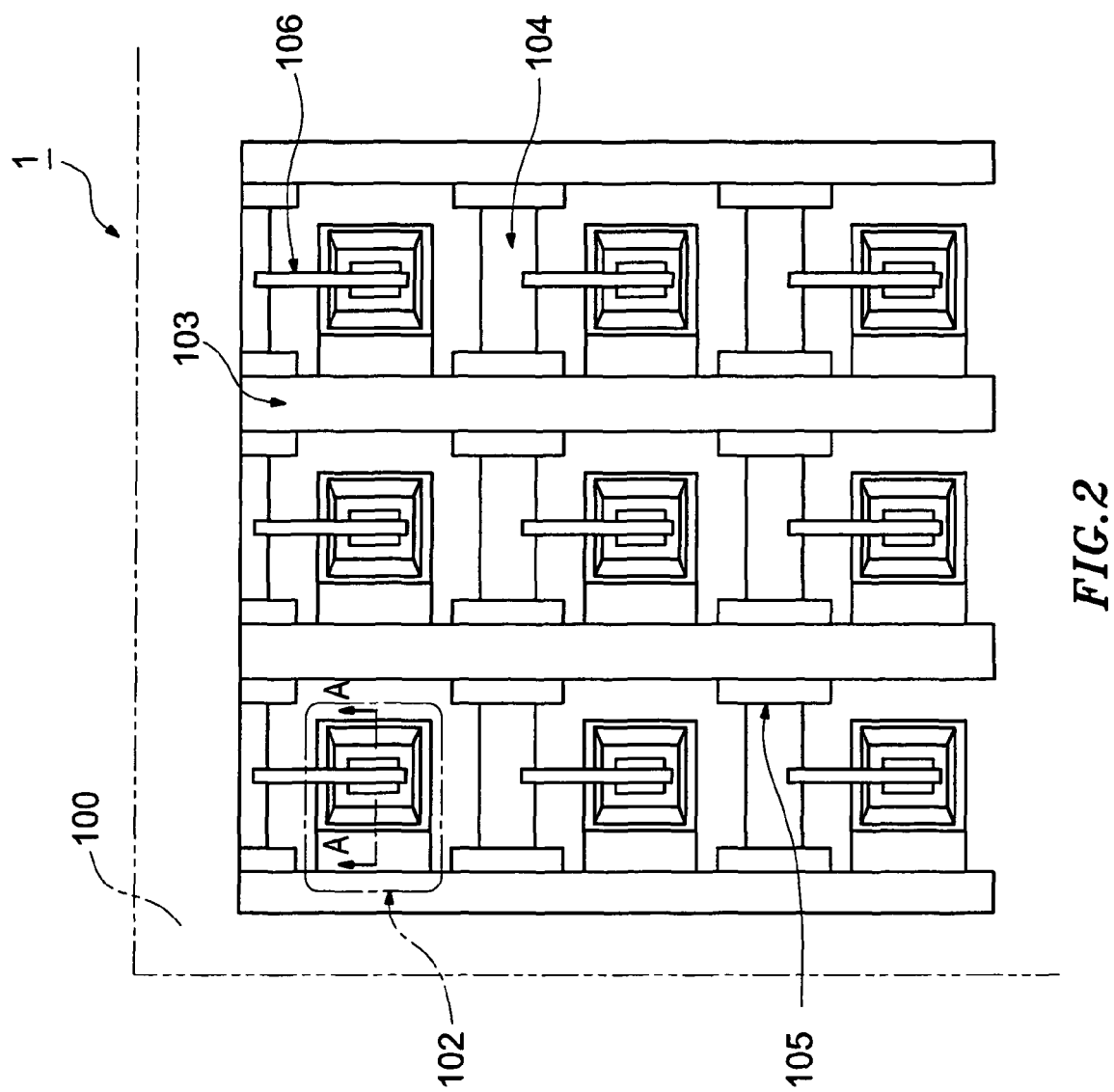
FIG. 2 is a plane enlargement drawing showing a display apparatus in embodiment 1.
Figure 3:
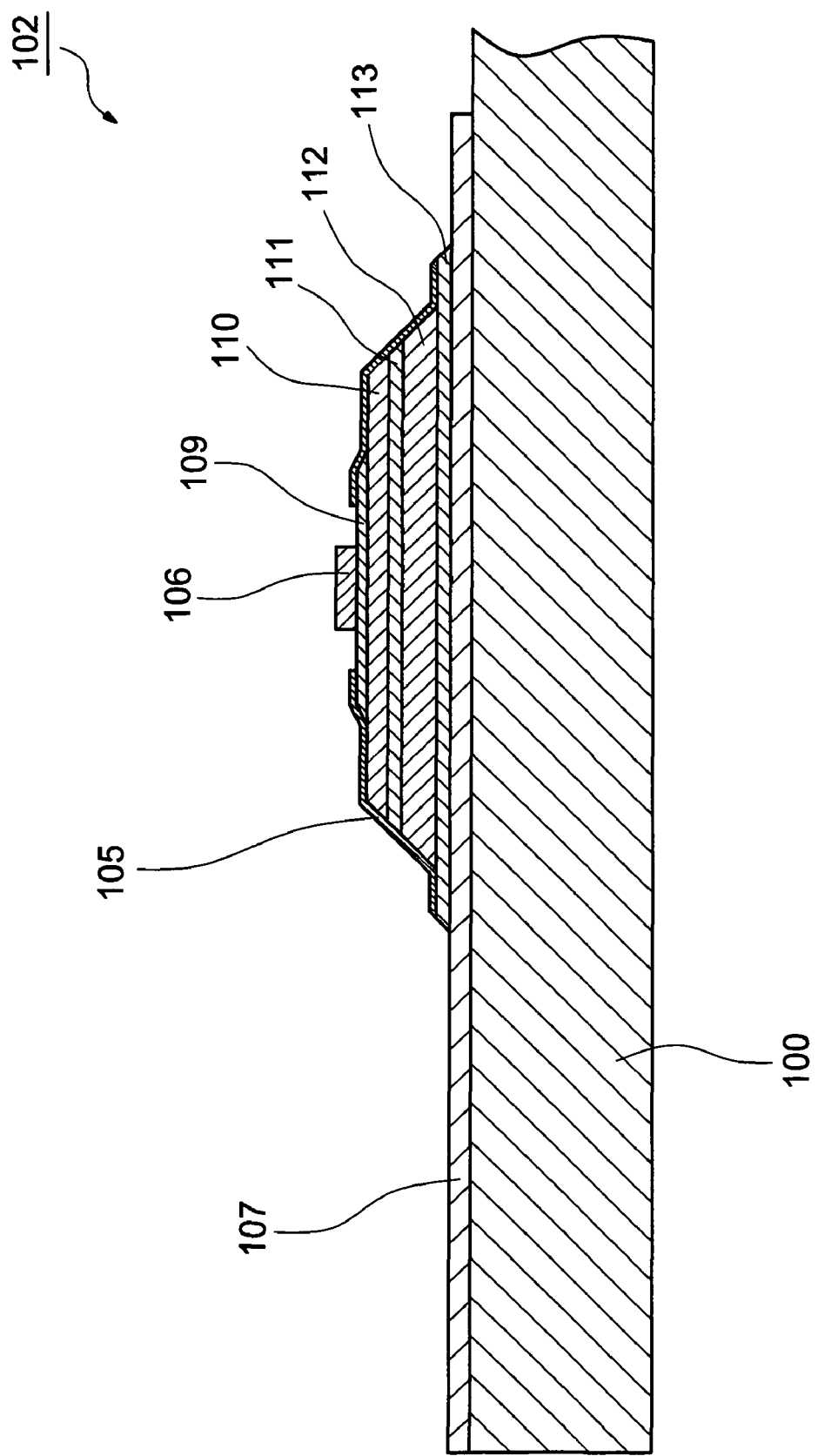
FIG. 3 is a sectional enlargement drawing showing a display apparatus in embodiment 1.

FIG. 2 is a plane enlargement drawing showing a display apparatus in embodiment 1; and FIG. 3 is a sectional enlargement drawing showing a display apparatus in embodiment 1.

The FIG. 3 is an A-A sectional diagram including the thin film LED 102 in the FIG. 2.

Next is to explain the display apparatus 1 and the thin film LED 102 in detail through using the FIG. 2 and the FIG. 3.

As shown by the FIG. 2, the display apparatus 1 comprises a plastic substrate 100, thin film LED 102 serving as semiconductor thin film element, vertical distribution 103, transverse wiring 104, interlayer insulation film 105 and connection wiring (transverse) 106.

The plastic substrate 100 is used for mounting the thin film LED 102, and it is a thin plate made from organic material represented by polyethylene terephthalate (PET). Moreover, as the organic material, polyimide, polycarbonate, Polyethylene Naphthalate or aramid can also be adopted. The thin film LED 102 is a LED of M dots×N dots formed on the plastic substrate 100 in a thin film shape. The vertical wiring 103 is an electroconductive thin film to connect with a cathode of the thin film LED 102 formed on the plastic substrate 100. The vertical wiring 103 is a metal wiring obtained through accumulating metal material such as gold or aluminum, or above-stated metal material with nickel, or titanium or the like onto the plastic substrate 100 in a thin film lamination, and it connects with cathodes of respective thin film LEDs 102. In addition, the vertical wiring 103 and the inner surface electrode 107 are integrated in the present embodiment.

The transverse wiring 104 is an electroconductive thin film to connect with an anode of the thin film LED 102 formed on the plastic substrate 100. The transverse wiring 104 is a metal wiring obtained through accumulating metal material such as gold or aluminum, or above-stated metal material with nickel, or titanium or the like onto the plastic substrate 100 in a thin film lamination, and it connects with anodes of respective thin film LEDs 102.

The interlayer insulation layer 105 is accumulated for obtaining an interlayer insulation between the vertical wiring 103 and the transverse wiring 104, e.g. it is an insulation thin film such as oxidation silicon and etc. The connection wiring (transverse) 106 is metal wiring obtained through accumulating metal material such as gold or aluminum, or above-stated metal material with nickel, or titanium or the like used for connecting an upper contact layer 109 (FIG. 3) described below and the transverse wiring 104 onto the plastic substrate 100 in a thin film lamination.

As shown by FIG. 3, an upper contact layer 109, an upper clad layer 110, an active layer 111, a lower clad layer 112 and a lower contact layer 113 are accumulated. Inclined side surfaces of such layers are covered by the interlayer insulation film 105, so that the thin film LED 102 is accumulated on the plastic substrate 100 via the inner surface electrode 107.

The inner surface electrode 107 is an electrode for supplying electric field intensity with the upper contact layers 109 in order to make the thin film LED 102 emit light; in the present invention, the inner surface electrode 107 can also be used as a metal layer for effectively releasing heat produced when making the thin film LED 102 emit light. In the present embodiment, the inner surface electrode 107 is integrated with the vertical wiring 103 (FIG. 2).

That is, the thin film LED 102 is characterized in that: it is solidly bonded on the surface of the inner surface electrode 107 serving as a heat release layer, for example, a metal layer of Au, AuGeNi, Al, AlNd, Ti, Ni, Pt, Ag, Pd, Cu and etc.; or for example, a transparent electrode layer of ITO, ZnO2, In2O3 and etc., through intermolecular force of hydrogen bond. Moreover, such heat release layers is formed by well-known vapor deposition method and sputter method, and the heat conductivity is better above 50 W/mK.

As mentioned above, because the thin film LED 102 is solidly bonded with the inner surface electrode 107 formed as heat release layer through intermolecular force of hydrogen bond, the bonding surface of the thin film LED 102 and the bonded surface of the plastic substrate are controlled as the surface roughness, that is, the typical height difference between the concave peak or convex peak and valley is about 5 nm below.

In order to further strengthen bonding force, it is better to clean and activate these bonding surfaces by an energy wave (e.g. plasma apparatus and so on). Moreover, coating with an active agent is also a method for activating the bonding surface.

After LED thin film plurally and integratively generated in a rectangle shape is solidly bonded on the surface of the inner surface electrode 107 formed as a heat release layer by intermolecular force of hydrogen bond, the thin film LED 102 is formed by a photolithographic etching method.

The above-stated LED thin film is grown on a GaAs substrate, a sapphire substrate, an InP substrate, a glass substrate, a quartz substrate or a Si substrate via a sacrificial layer by well-known metal organic chemical vapor deposition method (MOVPE method), metal organic vapor phase epitaxy method (MOVPE method), molecular beam epitaxy method (MBE method) and etc.

Because the LED thin film (thin film LEDs 102) can be thinned to a thickness below e.g. 5 μm, the LED thin film is characterized in an extremely strong flexibility. Moreover, unlike liquid crystal and organic EL, the LED thin film (thin film LEDs 102) uses material made by semiconductor epitaxial growth method, material with a high quality and a high reliability. Therefore, it is possible to ensure high quality and high reliability.

The LED thin film is formed by epitaxial growth so as to furnish a sacrificial layer capable of performing a selective etching. Through selectively etching the sacrificial layer, a LED thin film is formed by using lift-off method. Moreover, in the case that it is compound semiconductor such as LED elements of GaN system and etc. so that it is difficult to selectively etch the sacrificial layer, as a means to thinning thin film, it is possible to use a treatment to grind the inner surface of substrate. In the case, the LED thin film may be thinned so that a thickness including an epitaxial growth layer needed for LED emitting element is about 50 μm below, the thinned LED thin film may be used as LED emitting element. The LED thin films formed on the flexible substrate can be arranged to form the thin film LED 102 by well-known photolithographic technology.

Through injecting current between the transverse wiring 104 and the vertical wiring 103 toward a bias voltage direction, the thin film LED 102 formed on the plastic substrate 100 emits light. Because the thin film LED 102 can be thinned to a thickness below e.g. 5 μm, it can have a flexibility. Even if it is formed on plastic substrate 100, it can operate as an emitting element capable of ensuring high quality and high reliability. In addition, when thin film LED 102 operates, huge heat happens due to absorption of power that does not contribute to emitting light or emitted light. Here, according to the present invention, the heat can be effectively released toward the outside of the apparatus via the inner surface electrode 107 formed as a heat release layer.

Explanation of Effect:

As mentioned above, through interposing the inner surface electrode 107 formed as heat release layer between the plastic substrate 100 and the thin film LED 102, it is possible to effectively release heat produced inside the thin film LED 102. As a result, it is possible to obtain such display apparatus having long life, high output and high reliability.

Embodiment 2

Figure 4:
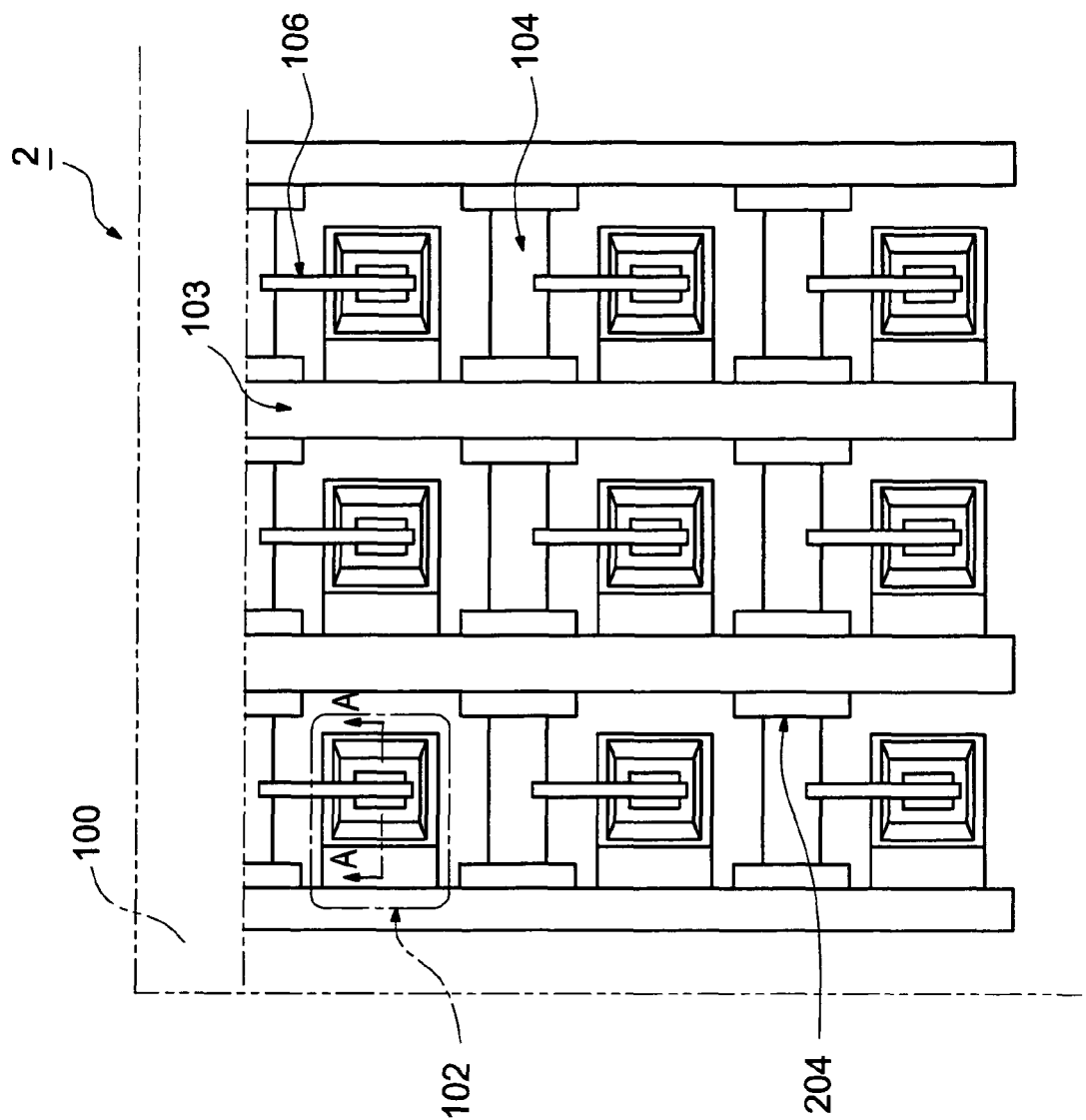
FIG. 4 is a plane enlargement drawing of embodiment 2.
Figure 5:
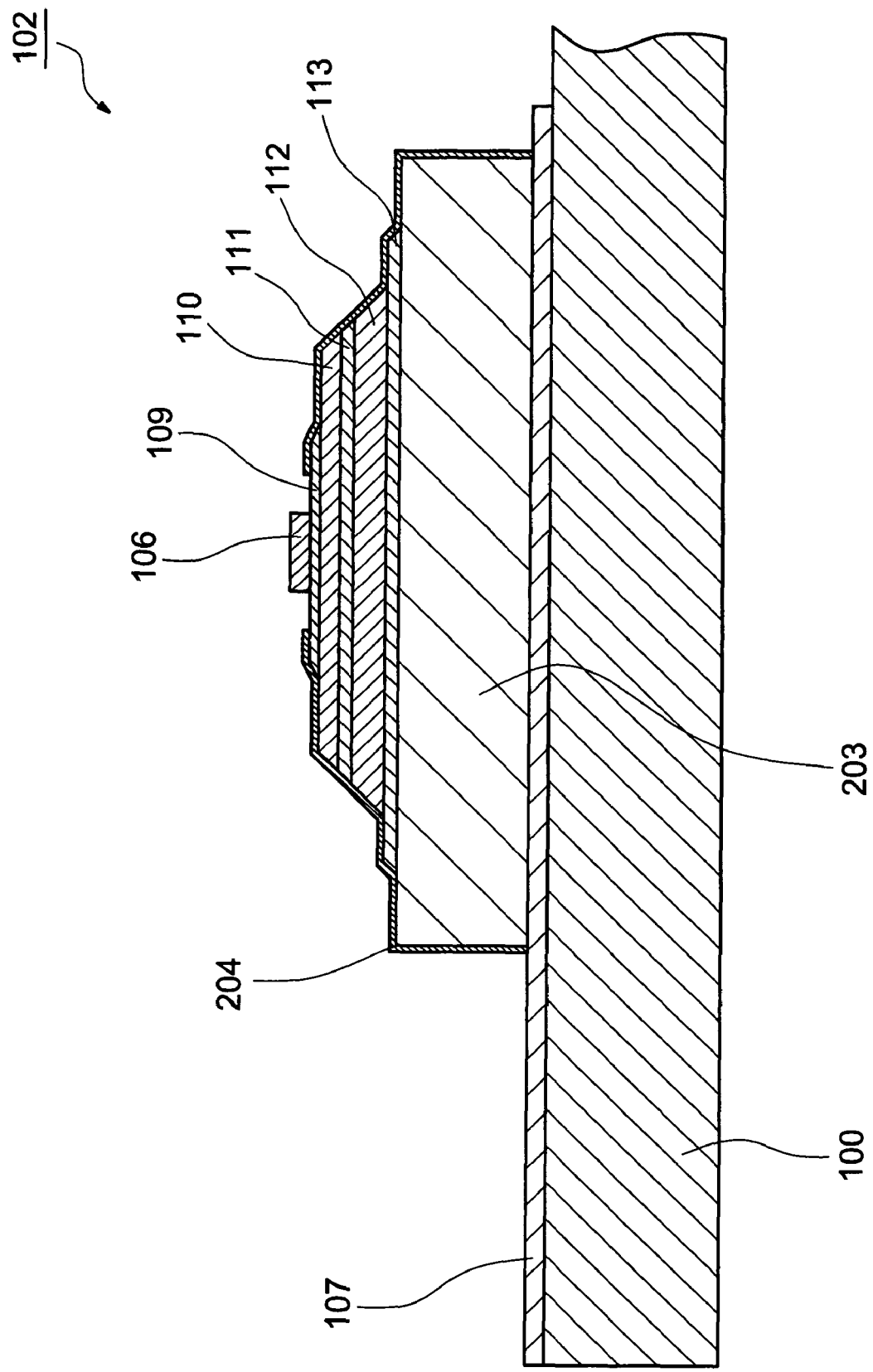
FIG. 5 is a sectional enlargement drawing showing a display apparatus in embodiment 2.

FIG. 4 is a plane enlargement drawing of embodiment 2; and FIG. 5 is a sectional enlargement drawing showing a display apparatus in embodiment 2.

The FIG. 5 is an A-A sectional diagram including the thin film LED 102 in the FIG. 4.

Next is to explain the display apparatus 2 and the thin film LED 102 in detail through using the FIG. 4 and the FIG. 5. Moreover, regarding a plane drawing showing overall structure of a display apparatus in embodiment 2, it is omitted because it is the same as FIG. 1.

As shown by the FIG. 4, the display apparatus 2 comprises a plastic substrate 100, thin film LED 102 serving as semiconductor thin film element, vertical distribution 103, transverse wiring 104, interlayer insulation film 204 and connection wiring (transverse) 106. The following is only to explain the components different from the embodiment 1, regarding the same components as the embodiment 1, they will be assigned to the same symbols and their explanations will be omitted.

The interlayer insulation layer 204 is accumulated for obtaining an interlayer insulation between the vertical wiring 103 and the transverse wiring 104, e.g. it is an insulation thin film such as oxidation silicon and etc. Further, in the present embodiment, the interlayer insulation layer 204 also is used as insulation thin film to cover a thick film heat conductive layer 203 (FIG. 5).

As shown by FIG. 5, an upper contact layer 109, an upper clad layer 110, an active layer 111, a lower clad layer 112 and a lower contact layer 113 are accumulated. Inclined side surfaces of such layers are covered by the interlayer insulation film 204, so that the thin film LED 102 is accumulated on the plastic substrate 100 via the thick film heat conductive layer 203.

The thick film heat conductive layer 203 is a metal heat release layer with a thickness of 5 μm~10 μm and is arranged just under a heat region of the thin films LED 102. As a thickening method, it may be electrolytic plating method; and it also may be a method to pattern as only thickening the heat region. Moreover, as electrolytic plating material, similar to the embodiment 1, many materials are available. However, such material having heat conductivity above 50 W/mK is desired.

Similar to the embodiment 1, through injecting current into between the transverse wiring 104 and the vertical wiring 103 toward a bias voltage direction, the thin film LED 102 formed on the plastic substrate 100 emits light. Further, similar to the embodiment 1, because the thin film LED 102 can be thinned to a thickness below e.g. 5 μm, it can have a flexibility. Even if while forming it on plastic substrate 100, it can operate as emitting element capable of ensuring high quality and high reliability.

Then, in the embodiment 2, because the thickened thick film heat conductive layer 203 is furnished just under the heat region, in the region heat concentrates, it is possible to partially increase heat capacity. Therefore, comparing with the embodiment 1, it is possible to process abrupt temperature change and to release heat effectively.

Explanation of Effect:

Through furnishing a thickened metal heat release layer (the thick film heat conductive layer 203) just under the heat region of the thin film LED 102, heat capacity becomes big, so it is possible to process abrupt temperature change and to release heat effectively.

Embodiment 3

Figure 6:
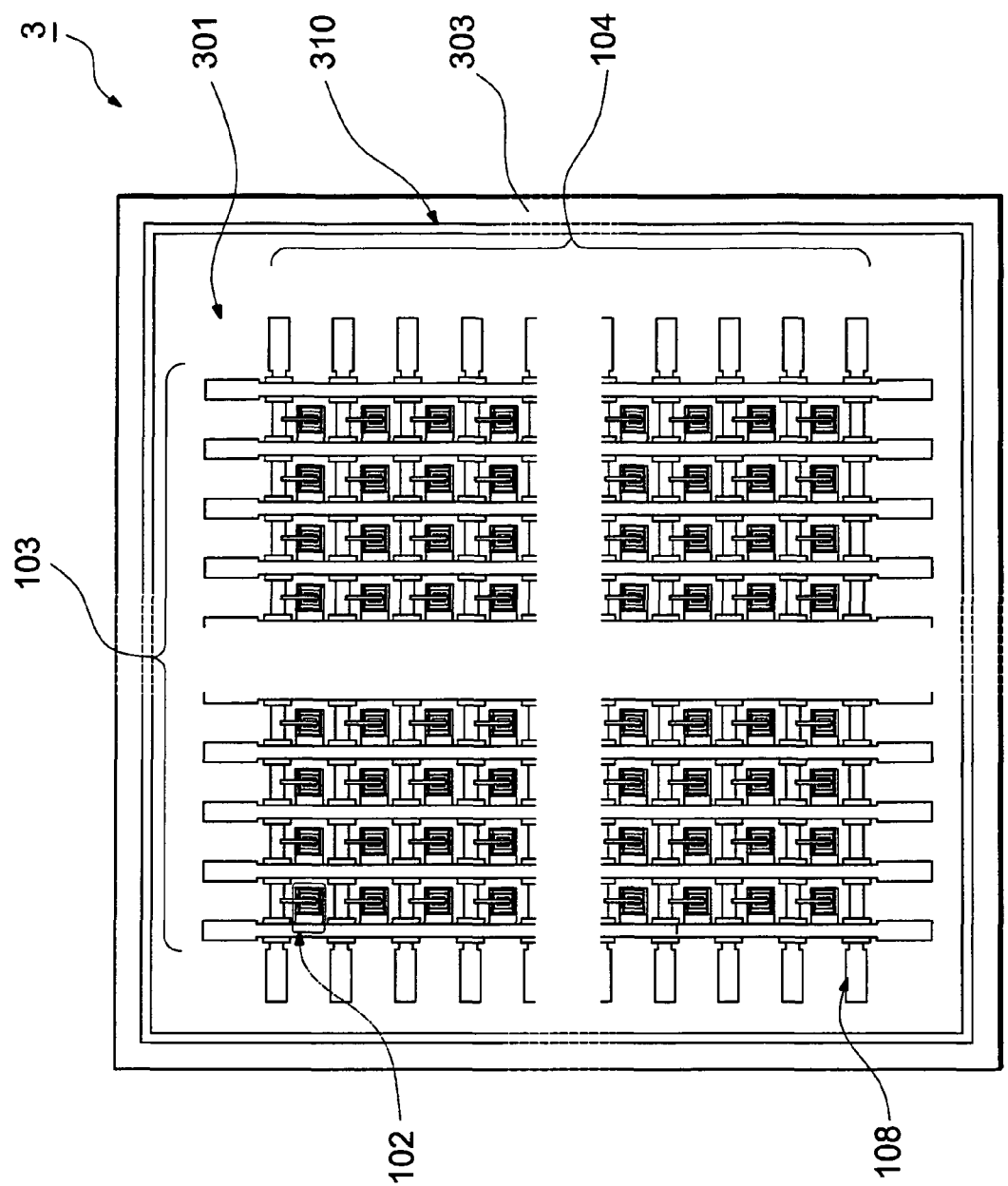
FIG. 6 is a plane drawing showing overall structure of a display apparatus in embodiment 3.

FIG. 6 is a plane drawing showing overall structure of a display apparatus in embodiment 3.

As shown by the FIG. 6, in the display apparatus 3 in the embodiment 3, a heat conductive layer 310 and a smooth layer 301 are accumulated on a plastic substrate, and on which a plurality of thin film LEDs 102 are accumulated as semiconductor thin film elements in a matrix manner. Further, anodes in the same queue of the thin film LEDs 102 are connected with a transverse wiring 104 having connection use pad 108, and cathodes in the same row of the thin film LEDs 102 are connected with a vertical wiring 103 having connection use pad 108. Furthermore, on the four sides surrounding the display apparatus 3, a metal frame 303 used for heat release is accumulated. Here, the metal frame 303 used for heat release is a heat release plate to absorb the heat of the thin film LED 102 via the heat conductive layer 310 and release the heat to the air.

Figure 7:
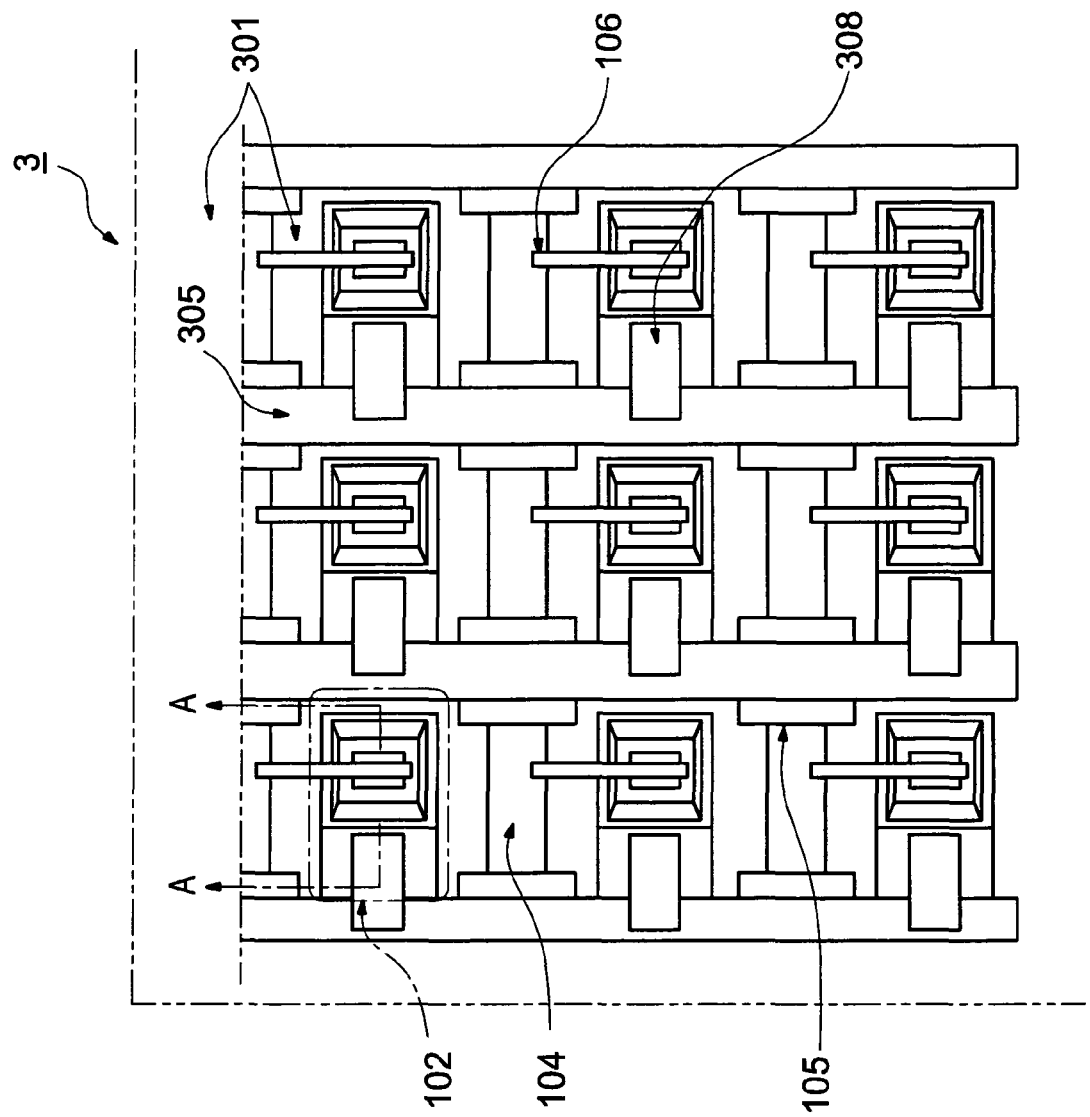
FIG. 7 is a plane enlargement drawing showing a display apparatus in embodiment 3.
Figure 8:
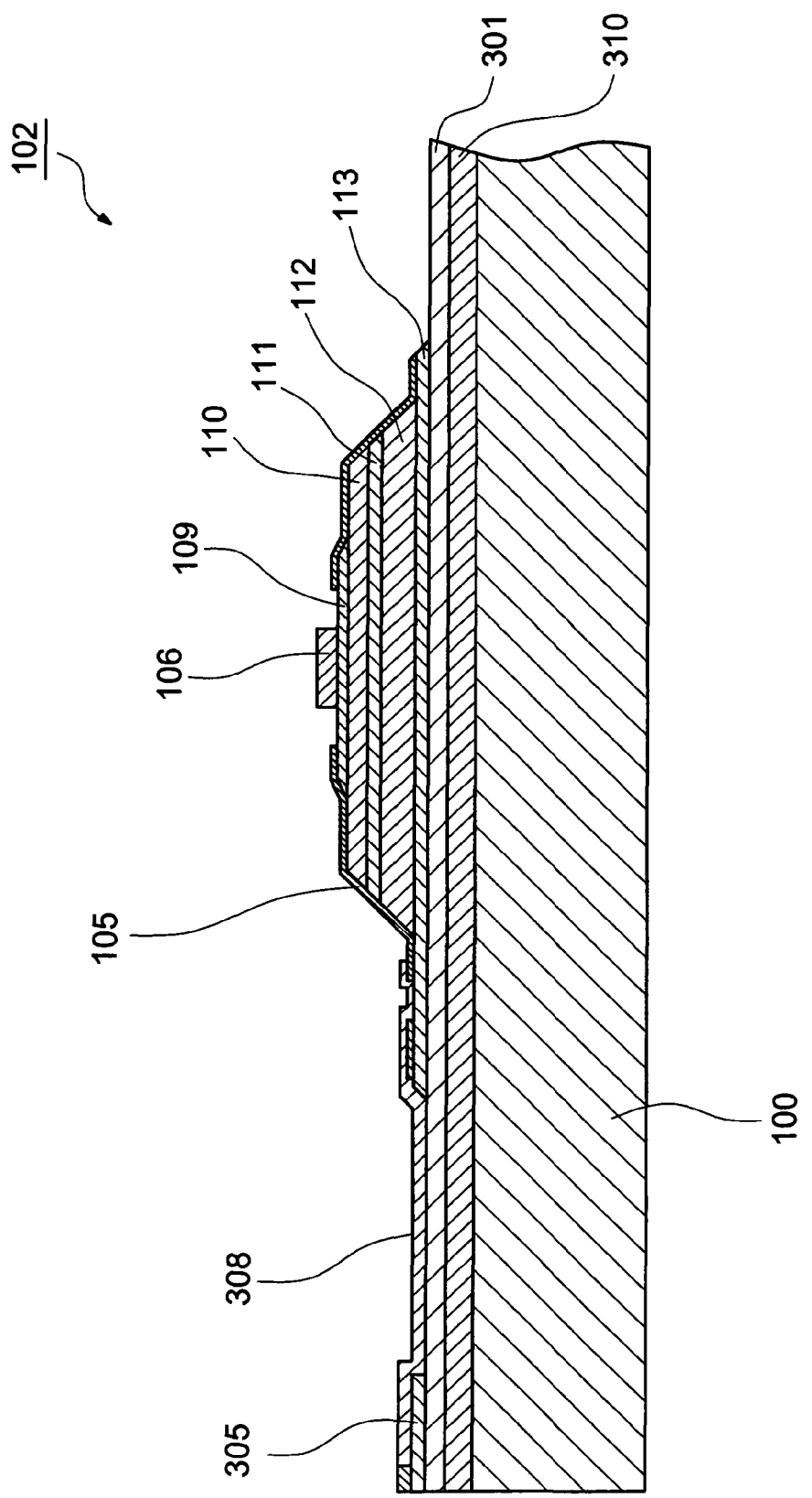
FIG. 8 is a first sectional enlargement drawing showing a display apparatus in embodiment 3.

FIG. 7 is a plane enlargement drawing showing a display apparatus in embodiment 3; and FIG. 8 is a first sectional enlargement drawing showing a display apparatus in embodiment 3.

The FIG. 8 is an A-A sectional diagram including the thin film LED 102 in the FIG. 7.

Next is to explain the display apparatus 3 and the thin film LED 102 in detail through using the FIG. 7 and the FIG. 8.

As shown in FIG. 7, a display apparatus 3 comprises a thin film LED 102 accumulated on the heat conductive layer 310 (FIG. 8) and the smooth layer 301 placed on the plastic substrate 100 in a matrix form, as semiconductor thin film element; a vertical wiring 305, a transverse wiring 104, an interlayer insulation film 105, a connection wiring (transverse) 106 and a connection wiring (vertical) 308. The following is only to explain the components different from the embodiment 1, regarding the same components as the embodiment 1, they will be assigned to the same symbols and their explanations will be omitted.

The heat conductive layer 310 (FIG. 8) is a metal layer accumulated on the plastic substrate 100 for releasing heat the thin film LED 102 produced; and made of, for example, Au, AuGeNi, Al, AlNd, Ti, Ni, Pt, Ag, Pd, Cu and etc. It is formed by well-known vapor deposition method and sputter method. And the heat conductivity of the heat conductive layer 310 is better above 50 W/mK.

The smooth layer 301 is a smooth coating layer accumulated for controlling the surface roughness, that is, the typical height difference between the concave peak or convex peak and valley below about 5 nm. In order to increase heat conductivity between the thin film LED 102 and the heat conductive layer 310 without shutting off, the smooth layer 301 is set below 2 μm. Generally, the smooth layer 301 better adopts organic compound materials, oxide materials or nitride material and is formed by well-known chemical vapor deposition method (CVD method), spin coating method, slit coating method, solution-soaking coating method and spray coating method.

The vertical wiring 305 is an electroconductive thin film to connect with cathode of the thin film LED 102 formed on the plastic substrate 100. The vertical wiring 305 is a metal wiring obtained through accumulating metal material such as gold or aluminum, or above-stated metal material with nickel, or titanium or the like onto the plastic substrate 100 in a thin film lamination, and it electrically connects with cathodes of respective thin film LEDs 102. In present embodiment, the vertical wiring 305 is not directly connected with cathode of the thin film LED 102, but is connected with the cathode of the thin film LED 102 via the connection wiring (vertical) 308.

As shown by FIG. 8, the upper contact layer 109, the upper clad layer 110, the active layer 111, the lower clad layer 112 and the lower contact layer 113 are accumulated. The thin film LED 102 whose inclined side surface is covered by the interlayer insulation film 105 is accumulated on the heat conductive layer 302 and the smooth layer 301 accumulated on the plastic substrate 100. In present embodiment, the vertical wiring 305 is not directly connected with the lower contact layer 113 of the thin film LED 102, but is connected with the lower contact layer 113 via the connection wiring (vertical) 308.

In the embodiment, similar to the embodiments 1 and 2, through injecting current into wiring, cathode and anode toward a bias voltage direction, the thin film LED 102 formed on the plastic substrate 100 emits light. Further, because the thin film LED 102 can be thinned to a thickness below e.g. 5 μm, it can have a flexibility. Even if forming it on plastic substrate 100, it can operate as emitting element capable of ensuring high quality and high reliability.

Moreover, similar to the embodiment 1 and embodiment 2, because formed the heat conductive layer 310 on the inner surface of the thin film LED 102, it is possible to effectively release heat produced by action of the thin films LED 102. In the present embodiment, through coating the smooth layer 301 on the heat conductive layer 310, not only the functions in the embodiment 1 and embodiment 2 can be obtained, but also it is possible to improve surface smoothness and obtain more solid bonding.

Explanation of Effect:

In the embodiment 1 and embodiment 2, through directly bonding the thin films LED 102 on the heat release layer (the inner surface electrode 107) and the thickened metal layer (the thick film heat conductive layer 203), the heat produced by the thin films LED 102 can be effectively released via these layers. However, in order to adjust surface roughness of such layers to below the 5 nm, enough attention must be paid with respect to film forming condition and film forming apparatus etc. And quality requirements for such films are also extremely strict. According to the embodiment, through coating the smooth layer 301 on the inner surface electrode 107, it is possible to easily adjust surface roughness to below 5 nm except the effect achieved in the embodiment 1. Therefore, it is possible to solidly bond the thin film LED 102 on the heat conductive layer 310.

The following explains expansion example of the embodiment.

Figure 9:
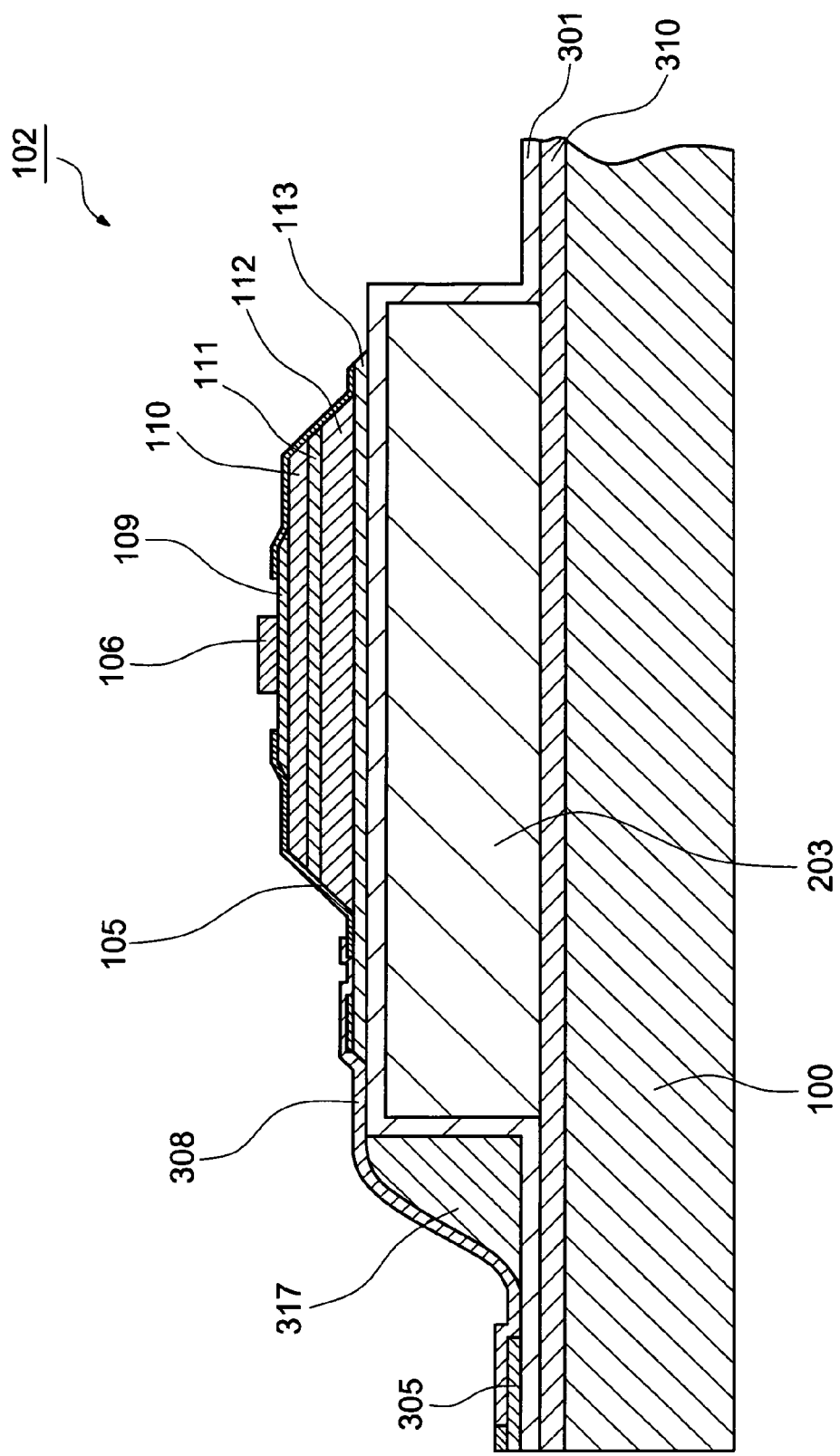
FIG. 9 is a second sectional enlargement drawing showing a display apparatus in embodiment 3.

FIG. 9 is a second sectional enlargement drawing showing a display apparatus in embodiment 3.

In the display apparatus 3 of the embodiment 3, a smooth layer is furnished between the inner surface electrode 107 (FIG. 3) and the thin films LED 102 (FIG. 3) of the display apparatus 1 in the embodiment 1. However, in the present expansion example, the smooth layer is furnished between the thick film heat conductive layer 203 (FIG. 5) and the thin films LED 102 (FIG. 5) of the display apparatus in the embodiment 2. In the case, through coating the surface of the thick film heat conductive layer 203 (FIG. 5), it is possible to easily adjust the surface roughness to below 5 nm. As a result, it is possible to solidly bond the thin film LED 102 (FIG. 5) on the thick film heat conductive layer 203 (FIG. 5).

Embodiment 4

Figure 10:
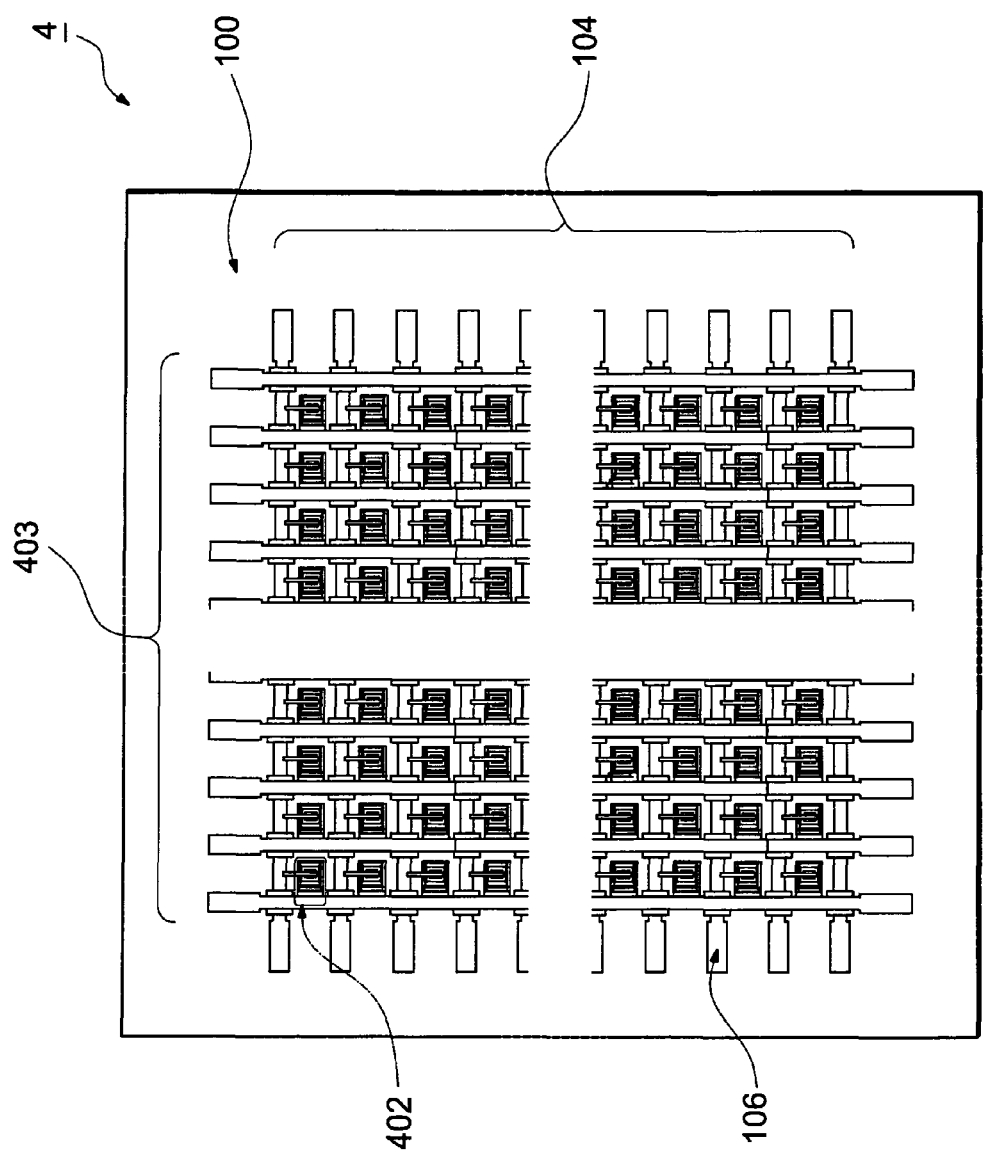
FIG. 10 is a plane drawing showing overall structure of a display apparatus in embodiment 4.

FIG. 10 is a plane drawing showing overall structure of a display apparatus in embodiment 4.

As shown by the FIG. 10, in the display apparatus 4 in the embodiment 4, a plurality of thin film LEDs 402 are arranged as semiconductor thin film elements in a matrix manner. Further, anodes in the same queue of the thin film LEDs 402 are connected with a transverse wiring 104 having connection use pad 108, and cathodes in the same row of the thin film LEDs 402 are connected with a vertical wiring 403 having connection use pad 108.

Figure 11:
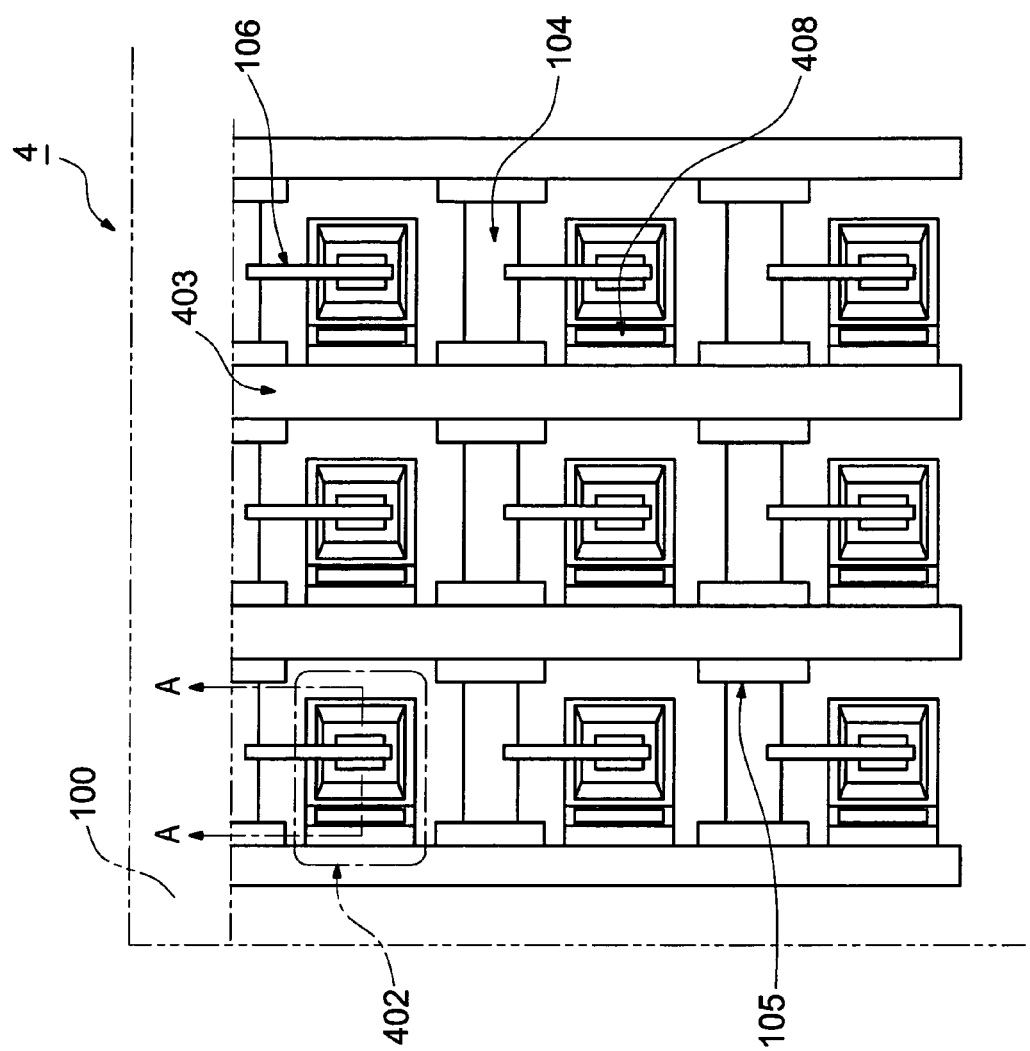
FIG. 11 is a plane enlargement drawing showing a display apparatus in embodiment 4.

FIG. 11 is a plane enlargement drawing showing a display apparatus in embodiment 4.

As shown in FIG. 11, a display apparatus 4 comprises a plastic substrate 100, a thin film LED 402 serving as semiconductor thin film element; a vertical wiring 403, a transverse wiring 104, an interlayer insulation film 105, and a connection wiring (transverse) 106.

Figure 12:
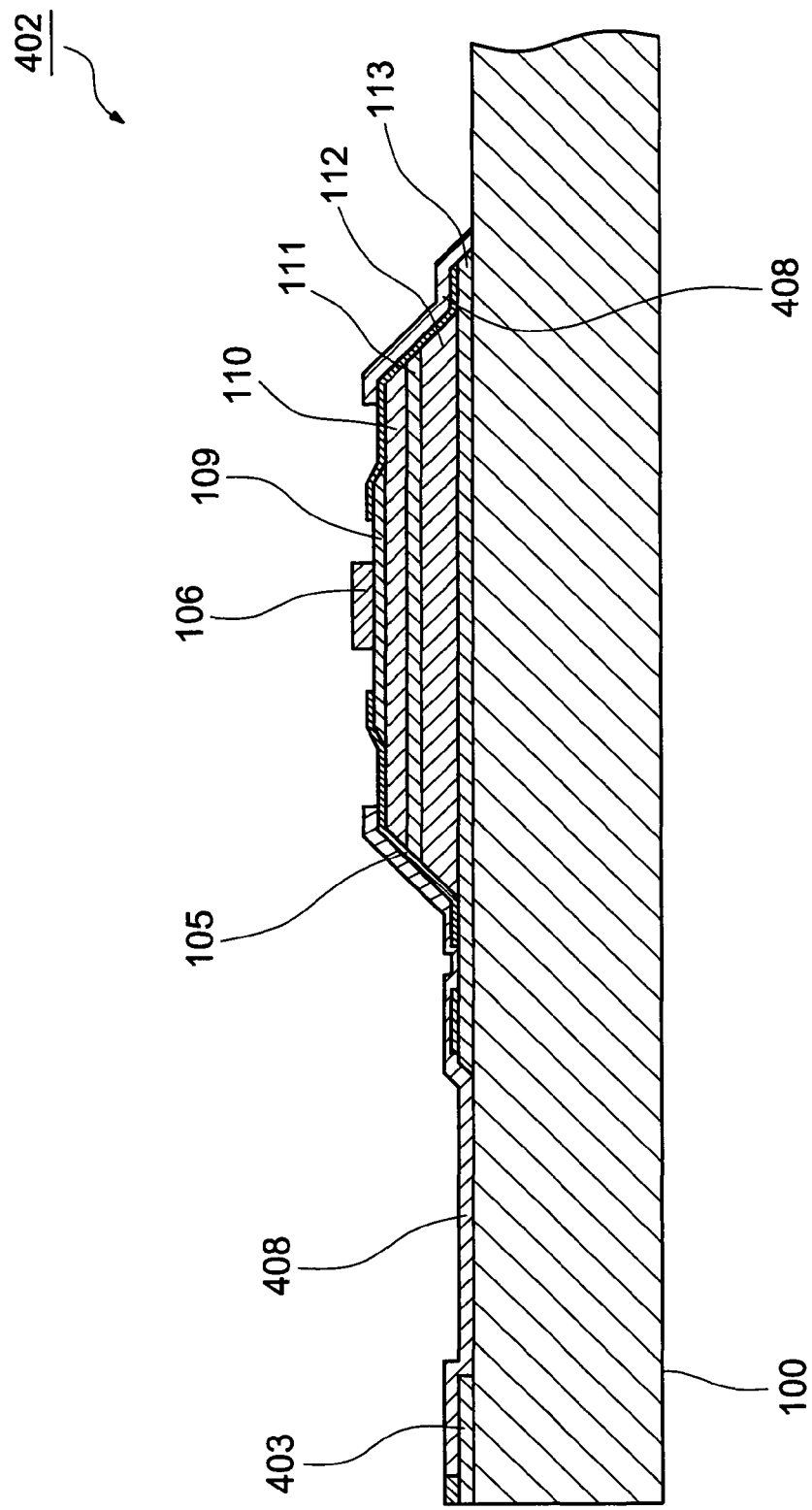
FIG. 12 is a first sectional enlargement drawing showing a display apparatus in embodiment 4.

FIG. 12 is a first sectional enlargement drawing showing a display apparatus in embodiment 4.

The FIG. 12 is an A-A sectional diagram including the thin film LED 402 in the FIG. 12.

Next is to explain the display apparatus 4 and the thin film LED 402 in detail through using the FIG. 11 and the FIG. 12.

As shown in FIG. 11, a display apparatus 4 comprises a plastic substrate 100, a thin film LED 402 serving as semiconductor thin film element; a vertical wiring 403, a transverse wiring 104, an interlayer insulation film 105, and a connection wiring (transverse) 106. The following is only to explain the components different from the embodiments 1~3, regarding the same components as the embodiments 1~3, they will be assigned to the same symbols and their explanations will be omitted.

The vertical wiring 403 is an electroconductive thin film to connect with cathode of the thin film LED 402 formed on the plastic substrate 100. The vertical wiring 403 is a metal wiring obtained through accumulating metal material such as gold or aluminum, or above-stated metal material with nickel, or titanium or the like onto the plastic substrate 100 in a thin film lamination, and it electrically connects with cathodes of respective thin film LEDs 402. In the present embodiment, the vertical wiring 403 is not directly connected with the cathode of the thin film LED 402, but is connected with the cathode of the thin film LED 402 via a heat conductive layer and connection wiring 408 (FIG. 12).

As shown by FIG. 12, an upper contact layer 109, an upper clad layer 110, an active layer 111, a lower clad layer 112 and a lower contact layer 113 are accumulated. The thin film LED 402 whose inclined side surface is covered by the interlayer insulation film 105 and the heat conductive layer and connection wiring 408 is accumulated on the plastic substrate 100.

The heat conductive layer and connection wiring 408 is a thin film metal layer to cover the whole thin film LED 402 from the surface side. The thin film metal layer can be formed by a lengthy pattern of anode or cathode, also can be formed from a pattern completely separated from two poles. Moreover, the thin film metal layer can be formed by well-known vapor deposition method or sputter method; and it can be formed simultaneously with formation of anode or cathode. Considering the heat release performance of the thin film metal layer, the heat conductivity of the thin film metal layer is better above 50 W/mK.

In the embodiments 1~3, through improving the heat release performance from surface side of the thin film LED 402, as the element structure of the thin film LED 402 according to the embodiments 1-3, without furnishing a heat release layer between the thin film LED 402 and the plastic substrate 100, the heat release performance can be improved. Further, as explained in the embodiments 1~3, through furnishing a multiple heat release layer between the thin film LED 402 and the plastic substrate 100, the heat release performance can be more improved.

In the embodiment, similar to the embodiments 1~3, through injecting current into wiring, cathode and anode toward a bias voltage direction, the thin film LED 402 formed on the plastic substrate 100 emits light. Further, because the LED thin film (thin film LED 402) can be thinned to a thickness below e.g. 5 μm, it can have a flexibility. Even if forming it on plastic substrate 100, it can operate as emitting element capable of ensuring high quality and high reliability.

Explanation of Effect:

As explained above, according to the present embodiment, the heat produced by action of the thin film LED 402 can be effectively released via the heat conductive layer and connection wiring 408 furnished on the element surface side. Moreover, not only the heat conductive layer and connection wiring 408 can be formed as a lengthy pattern of anode or cathode, but also the heat conductive layer and connection wiring 408 can be formed as a pattern completely separated from two poles. Therefore, while forming the anode or the cathode, it is possible to simultaneously form the two poles to obtain such effect. Moreover, differently from the embodiments 1, 2 and 3, because the heat conductive layer and connection wiring 408 is formed on element surface of the thin film LED 402, it is possible to perform a material selection without considering a bonding strength with the plastic substrate 100. Furthermore, because the modes described with respect to the embodiments 1, 2 and 3 can be used in multiple, it is possible to further obtain an improved heat release performance.

The following explains expansion example of the embodiment.

Figure 13:
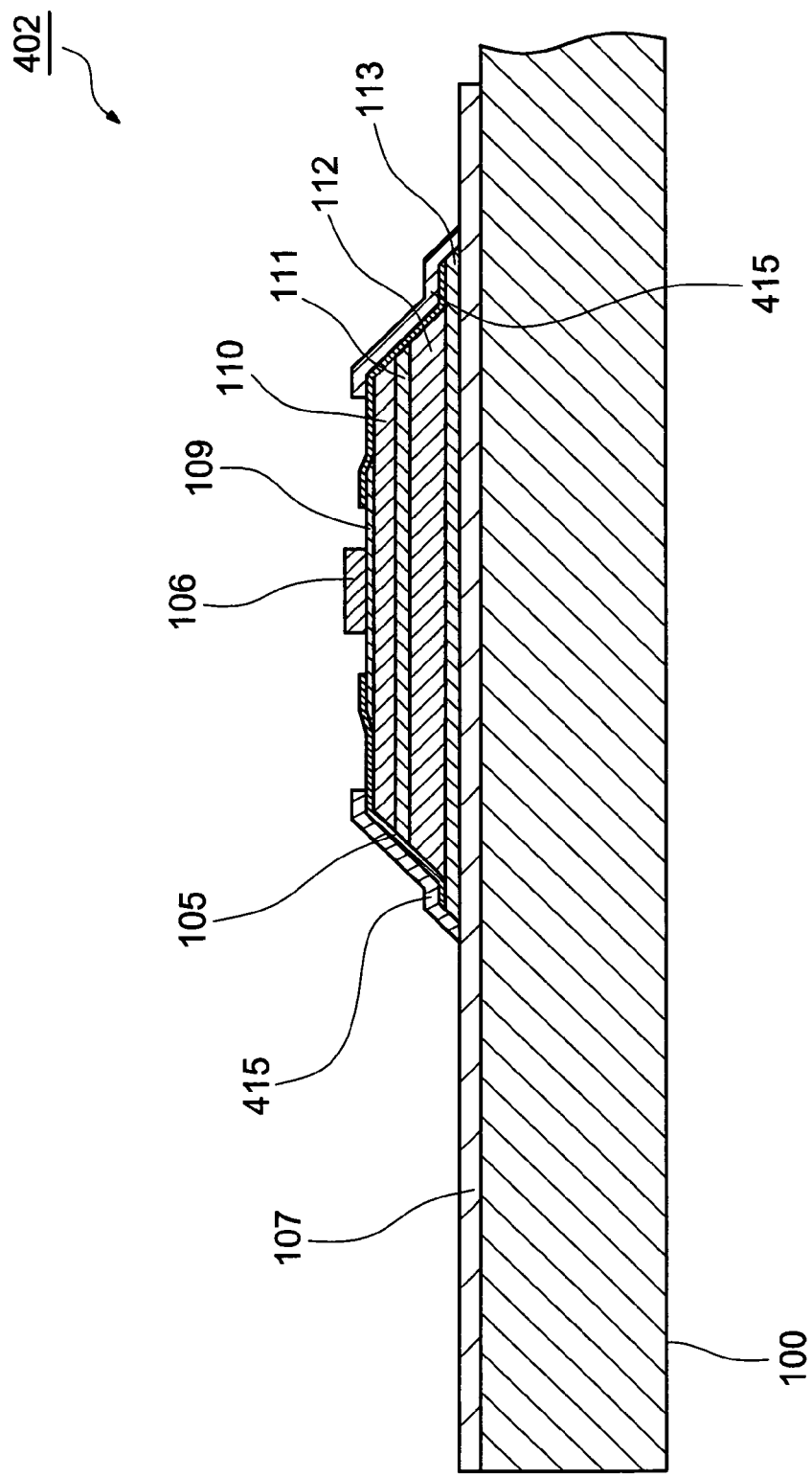
FIG. 13 is a second sectional enlargement drawing a display apparatus in embodiment 4.

FIG. 13 is a second sectional enlargement drawing a display apparatus in embodiment 4.

In the display apparatus 4 of the embodiment 4, the heat conductive layer and connection wiring 408 is accumulated on the element surface side of the thin film LED 102 (FIG. 8) of the display apparatus 3 of the embodiment 3. However, in the expansion example, it is to accumulate a heat conductive layer 415 on the element surface side of the thin film LED 102 (FIG. 3) of the display apparatus 1 in the embodiment 1. In the case, the same effects as the embodiment 4 can be obtained.

Embodiment 5

Figure 14:
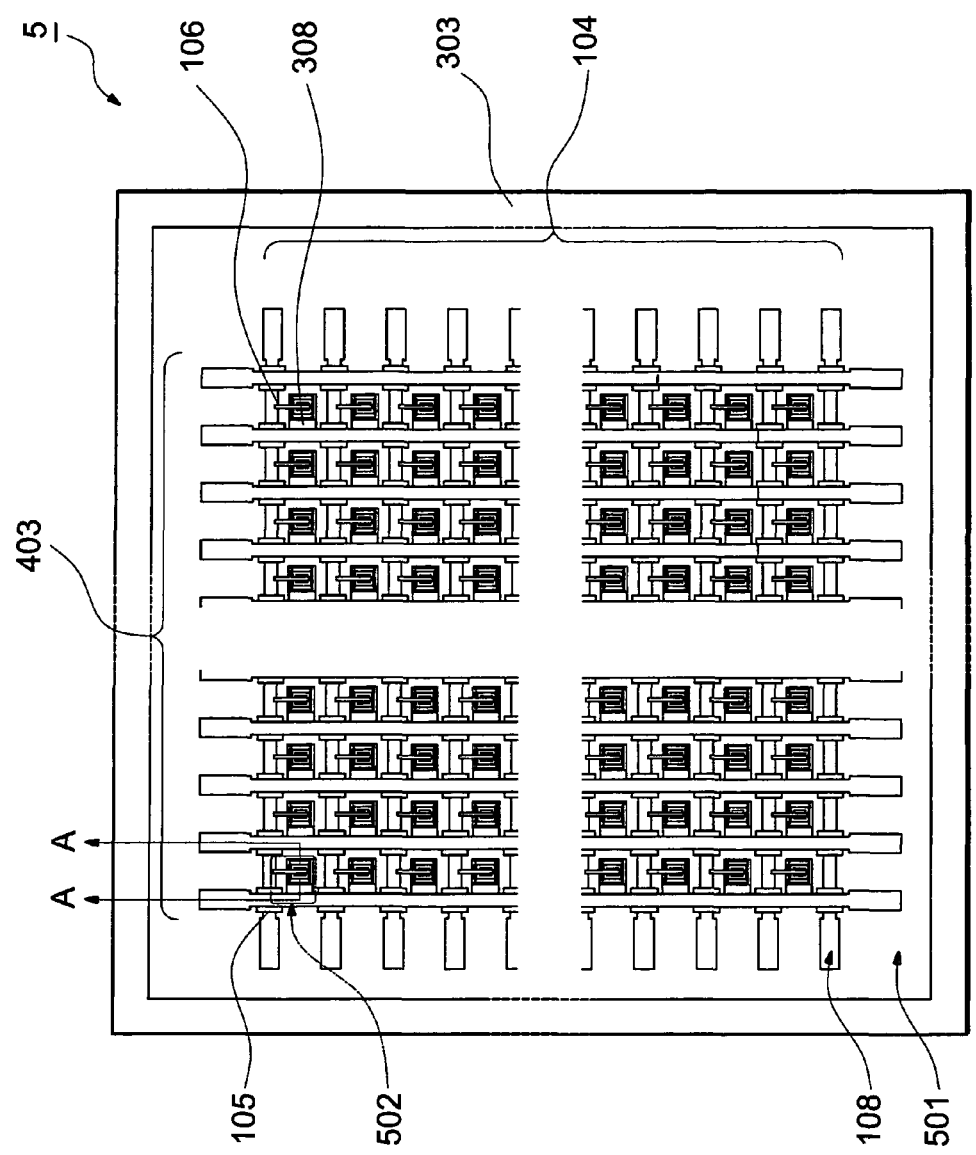
FIG. 14 is a plane drawing showing overall structure of a display apparatus in embodiment 5.

FIG. 14 is a plane drawing showing overall structure of a display apparatus in embodiment 5.

As shown by the FIG. 14, in a display apparatus 5 of the embodiment 5, a plurality of thin film LEDs 502 are accumulated as semiconductor thin film elements on the plastic substrate 100. Subsequently, on which a passivation film 503 (as described below) and a heat conductive layer 501 are accumulated as covering the whole display apparatus 5. The following is only to explain the components different from the embodiments 1~4, regarding the same components as the embodiments 1~4, they will be assigned to the same symbols and their explanations will be omitted.

Figure 15:
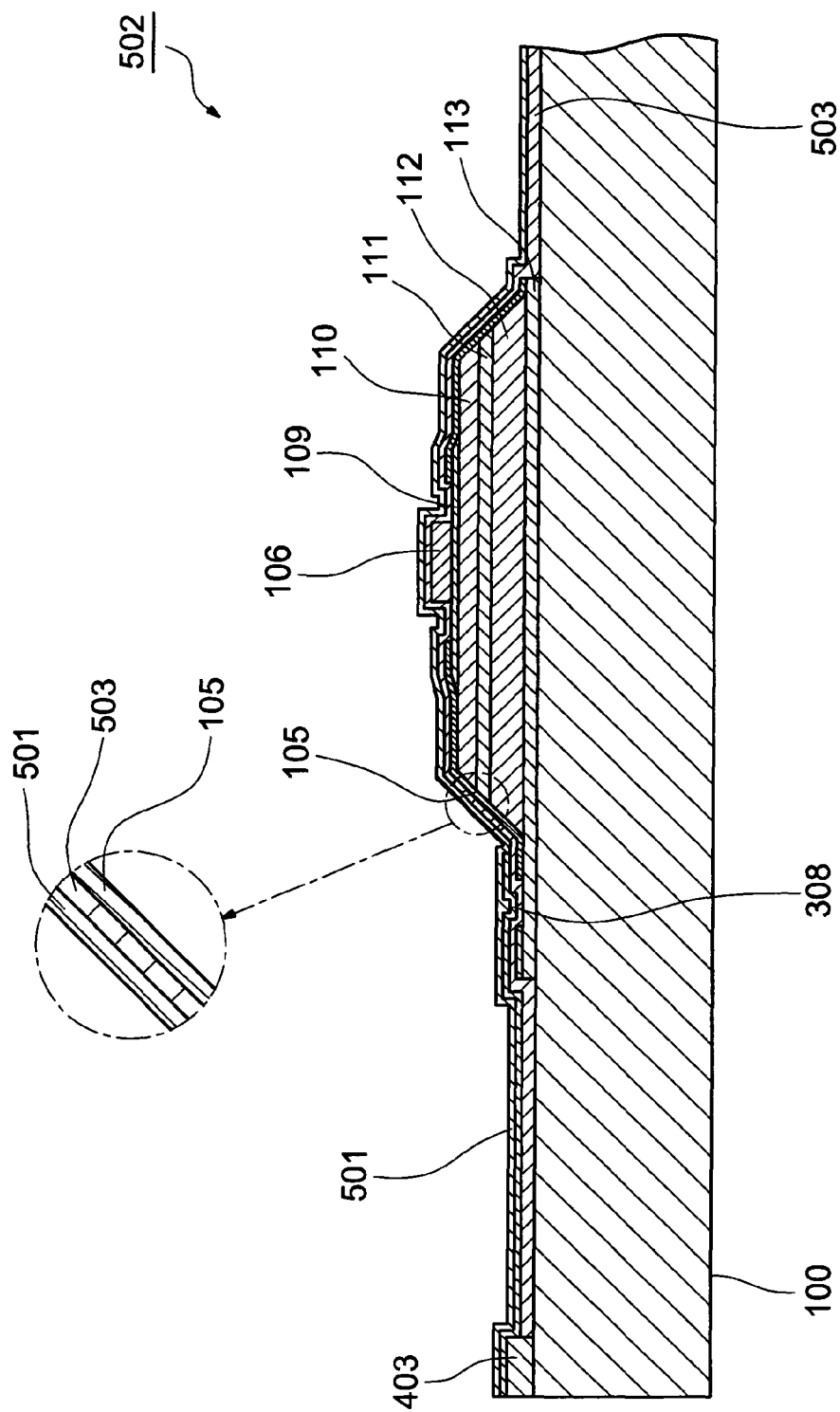
FIG. 15 is a sectional enlargement drawing showing a display apparatus in embodiment 5.

FIG. 15 is a sectional enlargement drawing showing a display apparatus in embodiment 5.

As shown by FIG. 15, an upper contact layer 109, an upper clad layer 110, an active layer 111, a lower clad layer 112 and a lower contact layer 113 are accumulated. The thin film LED 502 whose inclined side surface is covered by an interlayer insulation film 105, the passivation film 503 and the heat conductive layer 501 is accumulated on the plastic substrate 100.

The passivation film 503 is an insulation layer composed of a transparent oxide film or a transparent nitride film formed on element surface. The passivation film 503 must not shut off a heat conduction toward the heat conductive layer 501 with high heat conductivity placed on passivation film 503. Therefore, the passivation film 503 is better to have a film thickness above 500 nm. Moreover, the oxide film and nitride film can be formed by well-known plasma CVD method or sputter method.

The heat conductive layer 501 is a film with high heat conductivity accumulated on the passivation film 503. The heat conductive layer 501 is composed of a transparent conductive film such as ITO, $ZnO_2$, $In_2O_3$ and other, or an organic compound material with conductivity. Further, the heat conductive layer 501 can use metal material such as Au, Al and other to form film below e.g. 10 nm. Such films can be formed by well-known sputter method, vapor deposition method, spin coating method, slit coating method, solution-soaking coating method and spray coating method.

In the embodiment, similar to the embodiments 1~4, through injecting current into among wiring, cathode and anode toward a bias voltage direction, the thin film LED 502 formed on the plastic substrate 100 emits light. Further, like the embodiment 1, because the LED thin film (thin film LED 502) can be thinned to a thickness below e.g. 5 μm, it can have a flexibility. Even if while forming it on plastic substrate 100, it can operate as emitting element capable of ensuring high quality and high reliability.

In the element structure of the present embodiment, because a layer for releasing heat as covering a whole surface of the element is furnished, the heat produced by action of the thin film LED 502 can be released via a layer (heat conductive layer 501) with high heat conductivity. Moreover, through using element structures of the embodiments 1~4 in multiple, it is possible to further effectively release heat from the surface side and the inner surface side of the thin film LED 502.

Explanation of Effect:

As explained above, according to the present embodiment, because the heat produced by action of the thin film LED 402 can be effectively released via the heat conductive layer 501 with high heat conductivity for releasing heat, furnished on the element surface side, so heat release efficiency can be improved. Moreover, according to the present embodiment, the heat conductive layer 501 is furnished on the thin film LED 502 via the passivation film 503, it is possible to form the heat conductive layer 501 as covering the whole element of the thin film LED 502 without patterning. Therefore, a simple manufacturing method can be supplied.

In the above stated embodiments, it only explained that the present invention is applied to display apparatuses adopting a thin film LED. However, the present invention is not limited to the case, i.e. the present invention also can be applied to any display apparatuses comprising a semiconductive element capable of being accumulated on a plastic substrate.

The present invention is not limited to the foregoing embodiments but many modifications and variations are possible within the spirit and scope of the appended claims of the invention.

What is claimed is:

1. A display apparatus formed by bonding a semiconductor thin film element on a plastic substrate, comprising:
    a heat release layer placed between the plastic substrate and the semiconductor thin film element, the heat release layer comprising a plurality of heat release use electrodes formed as a matrix on a surface of the plastic substrate;
    wiring arranged in rows on the surface of the plastic substrate, each respective row of the wiring being connected to a corresponding row of the heat release use electrodes;
    a plurality of semiconductor thin film elements, each having a predetermined area of light emitting region between a first contact layer bonded on the heat release use electrode and a second contact layer; and
    other wiring arranged in lines and transversely to the wiring;
    wherein the second contact layer is bonded to the other wiring which intersects with the wiring, and further wherein the wiring is arranged over the other wiring, outside each semiconductor thin film element through an interlayer insulation film.

2. The display apparatus according to claim 1, wherein the heat release layer is formed by a metal layer.

3. The display apparatus according to claim 2, wherein the metal layer is partly thickened.

4. The display apparatus according to claim 1, wherein the heat release layer is formed by a transparent conductive film.

5. The display apparatus according to claim 1, wherein a flattening film is formed on the heat release layer.

6. The display apparatus according to claim 5, wherein the flattening film uses one of organic compound material, oxide material or nitride material.

7. The display apparatus according to claim 1, wherein the wiring is exposed on a surface of the display apparatus.

8. The display apparatus according to claim 1, wherein the wiring is arranged to release heat produced by the plurality of semiconductor thin film elements.

* * * * *